US009177924B2

(12) United States Patent
Colinge et al.

(10) Patent No.: US 9,177,924 B2
(45) Date of Patent: Nov. 3, 2015

(54) VERTICAL NANOWIRE TRANSISTOR FOR INPUT/OUTPUT STRUCTURE

(71) Applicant: Taiwan Semiconductor Manufacturing Company Limited, Hsinchu (TW)

(72) Inventors: Jean-Pierre Colinge, Hsinchu (TW); Ta-Pen Guo, Taipei (TW); Carlos H. Diaz, Mountain View, CA (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 138 days.

(21) Appl. No.: 14/132,076

(22) Filed: Dec. 18, 2013

(65) Prior Publication Data

US 2015/0171032 A1    Jun. 18, 2015

(51) Int. Cl.
*H01L 23/60* (2006.01)
(52) U.S. Cl.
CPC ...................................... *H01L 23/60* (2013.01)
(58) Field of Classification Search
CPC ............ H01L 27/0266; H01L 27/0255; H01L 27/0251; H01L 27/0262; H01L 27/0259; H01L 23/60
USPC .......................................................... 257/355
See application file for complete search history.

(56) References Cited

U.S. PATENT DOCUMENTS

| 5,287,241 | A | * | 2/1994 | Puar ................................. 361/56 |
| 5,493,142 | A | | 2/1996 | Randazzo et al. |
| 5,618,740 | A | | 4/1997 | Huang |
| 7,567,414 | B2 | | 7/2009 | Bertin et al. |

FOREIGN PATENT DOCUMENTS

EP    0739542 B1    5/2002

OTHER PUBLICATIONS

Liou, Juin; Challenges of Electrostatic Discharge (ESD) Protection in Silicon Nanowire Technology; Proceedings of the 28th International Conference on Microelectronics, Serbia; May 2012.
Liu, Changze, Yu, Tao, Wang, Runsheng, Zhang, Liangliang, Huang, Ru, Kim, Dong-Won, Park, Donggun, Wang, Yangyuan; Negative-Bias Temperature Instability in Gate-All-Around Silicon Nanowire MOSFETs: Characteristic Modeling and the Impact on Circuit Aging; IEEE Transactions on Electron Devices, 57(12); pp. 3442-3450; Dec. 2010.
Liu, Wen, Liou, Juin, Chung, Andy, Jeong, Yoon-Ha, Chen, Wei-Chen, Lin, Horng-Chih; Electrostatic Discharge Robustness of Si Nanowire Field-Effect Transistors; IEEE Electron Device Letters, 30(9); pp. 969-971; Sep. 2009.

(Continued)

*Primary Examiner* — Monica D Harrison
(74) *Attorney, Agent, or Firm* — Jones Day (57) ABSTRACT

Systems for protecting a circuit from an electrostatic discharge (ESD) voltage are provided. An input terminal receives an input signal. An ESD protection circuit receives the input signal from the input terminal. The ESD protection circuit includes one or more vertical nanowire field effect transistors (FETs). Each of the one or more vertical nanowire FETs includes a well of a first conductivity type. Each of the one or more vertical nanowire FETs also includes a nanowire having i) a source region at a first end of the nanowire, and ii) a drain region at a second end of the nanowire that is opposite the first end. The source region further includes a portion formed in the well, where the source region and the drain region are of a second conductivity type. A gate region surrounds a portion of the nanowire and is separated from the drain region by a distance.

20 Claims, 9 Drawing Sheets

(56) References Cited

OTHER PUBLICATIONS

Park, Jong Tae; Kim, Jin Young, Colinge, Jean Pierre; Negative-Bias-Temperature-Instability and Hot Carrier Effects in Nanowire Junctionless P-Channel Multigate Transistors; Applied Physics Letters, 100; 2012.

Wang, Runsheng, Huang, Ru, He, Yandong, Wang, Zhenhua, Jia, Gaosheng, Kim, Dong-Won, Park, Donggun, Wang, Yangyuan; Characteristics and Fluctuation of Negative Bias Temperature Instability in Si Nanowire Field-Effect Transistors; IEEE Electron Device Letters, 29(3); pp. 242-245; Mar. 2008.

\* cited by examiner

VERTICAL NANOWIRE TRANSISTOR FOR INPUT/OUTPUT STRUCTURE

TECHNICAL FIELD

The technology described in this disclosure relates generally to integrated circuits and more particularly to a system for protecting a circuit from an electrostatic discharge (ESD) voltage.

BACKGROUND

Gate-all-around (GAA) nanowire channel field-effect transistors (FETs) may enable feature scaling beyond current planar complementary-metal-oxide semiconductor (CMOS) technology. Nanowire channel FETs may also be of interest due to their electrostatics, which may be superior to those of conventional FET devices. The fabrication of nanowire channel FETs may include generating a collection of nanowires and placing them where desired (e.g., a bottom-up approach) or may include various lithographic patterning procedures (e.g., a top-down approach).

DETAILED DESCRIPTION

Figure 1A:
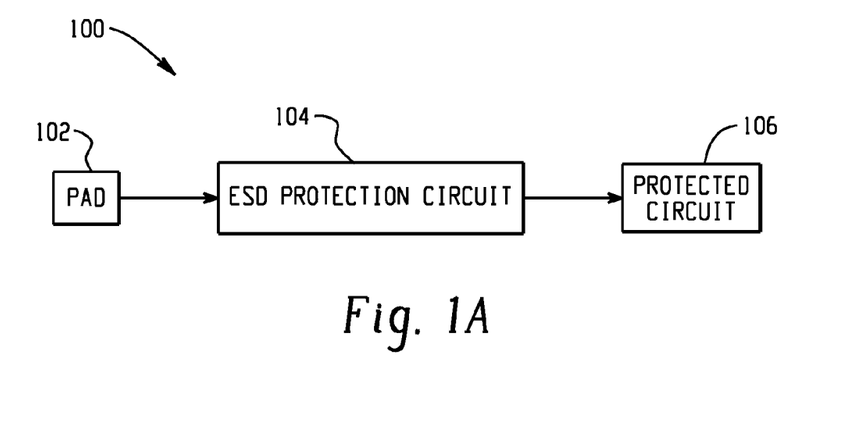
FIG. 1A depicts an example system for protecting a protected circuit from an electrostatic discharge (ESD) voltage.

FIG. 1A depicts an example system 100 for protecting a protected circuit 106 from an electrostatic discharge (ESD) voltage. In the example system 100, an input terminal 102 may be used to receive an input signal. As indicated in the example of FIG. 1A, the input terminal 102 may include, for example, an input pad that is used to receive the input signal from an external source. Alternatively, it may include an output pad that is used to send an output signal to the outside world. An ESD protection circuit 104 may be configured to receive the input signal from the input terminal 102. Alternatively, the ESD protection circuit 104 may be configured to send an output signal to an output terminal. As described in further detail below, the ESD protection circuit 104 may include one or more vertical nanowire field effect transistors (FETs). The one or more vertical nanowire FETs may have characteristics that can be used to attenuate an ESD-induced voltage in the input signal. For example, the one or more vertical nanowire FETs may be used to provide a resistance or a PN junction for attenuating the ESD-induced voltage in the input signal. In another example, the one or more vertical nanowire FETs may be used to provide a resistance or a PN junction for attenuating an ESD-induced voltage at the output terminal of the ESD protection circuit 104.

A protected circuit 106 may receive the input signal from the ESD protection circuit 104 after the ESD protection circuit 104 has attenuated the ESD-induced voltage in the input signal. For example, an ESD pulse applied to the input pad 102 may be attenuated by components of the ESD protection circuit 104, thereby reducing the ESD voltage applied to the protected circuit 106 and preventing damage to the protected circuit 106. ESD may be a cause of failure in metal oxide semiconductor field effect transistors (MOSFETs). ESD may cause a relatively large, undesired pulse of current to flow through elements of an integrated circuit (IC) chip. The current pulse may flow into a transistor from the gate, the drain, or the source. For example, an ESD pulse supplied to the transistor through a gate may break down a dielectric gate oxide barrier between the gate and a transistor channel, which may lead to permanent damage in the integrated circuit.

In the example system 100 of FIG. 1, the input terminal 102, the ESD protection circuit 104, and the protected circuit 106 may comprise portions of an integrated circuit. The integrated circuit may be divided conceptually between core transistors and input/output (I/O) transistors. The protected circuit 106 may include one or more core transistors that implement a design for the integrated circuit. As noted above, the ESD protection circuit 104 may include one or more vertical nanowire FETs, and the one or more vertical nanowire FETs may comprise I/O transistors that manage communications with external sources. ESD may arise from the external sources, and thus, the I/O transistors included in the ESD protection circuit 104 may require ESD protection to withstand the access from the external sources. Thus, in certain examples, the core transistors and the I/O transistors may have different characteristics (e.g., core transistors may be faster, while the I/O transistors may need to withstand the access from the outside world).

In conventional systems, two different types of transistors may be used for the core transistors and the I/O transistors. In such conventional systems, the use of the two different types of transistors may increase process complexity and cost. As described in further detail below, however, the example system 100 may use a single type of transistor for both the core transistors (e.g., those transistors included in the protected circuit 106) and the I/O transistors (e.g., those transistors included in the ESD protection circuit 104). The single type of transistor used may be the aforementioned vertical nanowire FET transistor. Specifically, in an example, the single type of transistor used for both the core and I/O transistors may be a junctionless, accumulation-mode nanowire transistor.

Figure 1B:
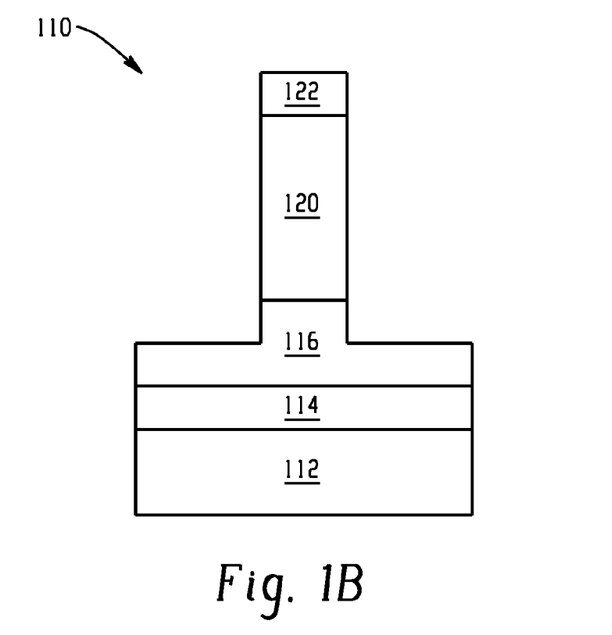
FIG. 1B depicts portions of an example vertical nanowire field effect transistor (FET).

FIG. 1B depicts portions of an example vertical nanowire field effect transistor (FET) 110. As described above, the ESD protection circuit 104 of FIG. 1A may include one or more vertical nanowire FETs. As depicted in FIG. 1B, the portions of the vertical nanowire FET 110 may include a source region 116, a drain region 122, and a nanowire channel 120 that connects the source and drain regions 116, 122. The nanowire channel 120 may comprise a silicon nanowire, among other types. The vertical nanowire FET 110 may be fabricated substantially over a substrate 112 and may extend in a substantially perpendicular manner from a well 114 formed in the substrate 112. The substrate 112 may be, for example, a bulk P-type silicon substrate, and the well 114 formed in the substrate 112 may be a P-type well or an N-type well. In an example, the well 114 may be formed via an ion implantation process.

FIG. 1B may depict a cross-sectional view of an example intermediate stage in the fabrication of the vertical nanowire FET 110. As illustrated in FIG. 1B, the source region 116 of the nanowire FET 110 may include i) a first portion at a first end of the nanowire channel 120, and ii) a second portion that is within the well 114. The drain region 122 may be formed at a second end of the nanowire channel 120 that is opposite the first end. In a completely fabricated state, a gate region (not depicted in FIG. 1B) may surround (e.g., wrap around) a portion of the nanowire, and the gate region may be used to regulate current flow through the nanowire channel 120 between the source and drain regions 116, 122. As described in further detail below, the gate region may be separated from the drain region 122 by a "drift region," and the separation of the gate and drain regions may be used to reduce an ESD-induced electric field in the gate region.

In the example vertical nanowire FET 110 of FIG. 1B, the well 114 may be of a first conductivity type, and the source and drain regions 116, 122 may be of a second conductivity type. Due to the differences in conductivity type, a PN junction may be formed between the well 114 and the portion of the source region 116 that is formed in the well. As described in further detail below, the PN junction formed may be used in the ESD protection circuit 104 to attenuate an ESD-induced voltage included in a received input signal. Specifically, the ESD protection circuit 104 may use multiple vertical nanowire FETs to provide multiple PN junctions of the type described above, such that the received input signal may be clamped within a voltage range as a result of the multiple PN junctions.

In the example of FIG. 1B, locations of the source and drain regions may depend on a direction of current flow and a bias applied to the vertical nanowire FET 110, such that the locations of the source and the drain may be reversed (i.e., swapped) by changing the bias applied to the FET 110. Therefore, references to a "source region" in this disclosure should be understood as referring to, more generally, a "bottom region," in light of the fact that the drain region may be located at a bottom of the transistor in some examples. Similarly, references to a "drain region" in this disclosure should be understood as referring to, more generally, a "top region," in light of the fact that the source region may be located at a top of the transistor in some examples.

Figure 1C:
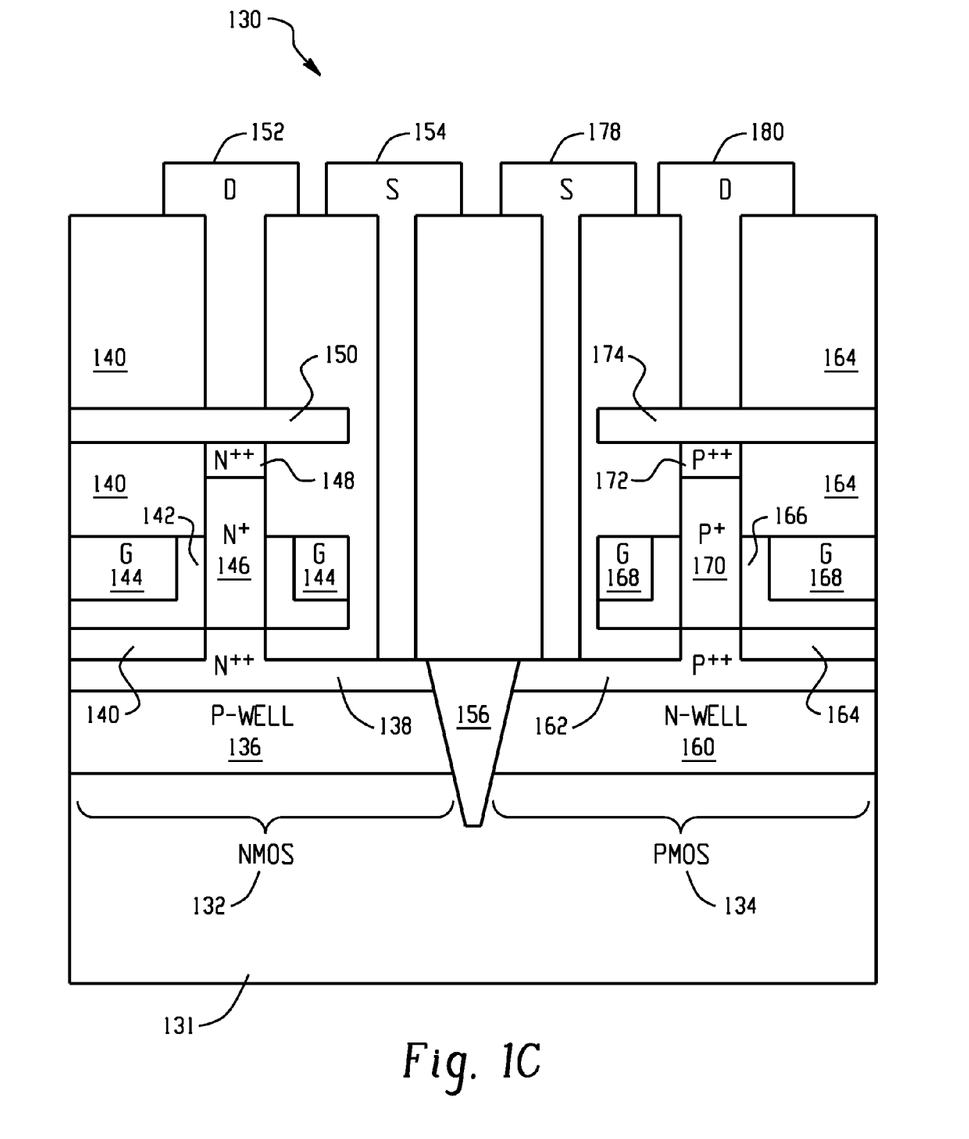
FIG. 1C depicts an example vertical, gate-all-around (GAA) complementary metal-oxide-semiconductor (CMOS) structure including an NMOS vertical nanowire FET and a PMOS vertical nanowire FET.

FIG. 1C depicts an example vertical, gate-all-around (GAA) complementary metal-oxide-semiconductor (CMOS) structure 130 including an NMOS vertical nanowire FET 132 and a PMOS vertical nanowire FET 134. In the example of FIG. 1C, the NMOS vertical nanowire FET 132 and the PMOS vertical nanowire FET 134 may be fabricated substantially over a semiconductor substrate 131 and may be separated from each other in the horizontal direction by a shallow trench isolation (STI) region 156.

The NMOS vertical nanowire FET 132 may include a P-type well 136 formed in the substrate 131. A nanowire included in the NMOS vertical nanowire FET 132 may include i) an N++ source region 138 that is formed at a first end of the nanowire, and ii) an N++ drain region 148 that is formed at a second end of the nanowire that is opposite the first end. The N++ source region 138 may further include a portion that is formed in the well 136 (e.g., the portion of the N++ source region 138 that is formed in the well 136 may be formed by exposing the portion of the well 136 to an ion implantation process, thus altering the conductivity type from P-type to N++ in the portion of the well 136).

The NMOS vertical nanowire FET 132 may further include an N+ nanowire channel 146 that connects the source and drain regions 138, 148. The NMOS vertical nanowire FET 138 may include a "gate-all-around" (GAA) transistor structure, such that a gate region may surround (e.g., "wrap around") a portion of the nanowire channel 146. Specifically, the gate region may include a gate dielectric 142 and a gate metal 144 that surround the portion of the nanowire channel 146. Above and below the gate dielectric 142 and the gate metal 144 of the gate region, interlayer dielectric (ILD) material 140 may surround portions of the nanowire. A drain silicide 150 may be in contact with the drain region 148 of the NMOS vertical nanowire FET 132, and a drain contact 152 may be connected electrically to the drain silicide 150. A source contact 154 may be in contact with the source region 138 (e.g., the source contact 154 may contact the source region 138 directly or the source contact 154 may be in contact with the source region 138 via a source silicide material, not shown).

The NMOS vertical nanowire FET 132 may include characteristics that can be used to attenuate an ESD-induced voltage included in an input signal, such that the NMOS vertical nanowire FET 132 may be used in the ESD protection circuit 104 of FIG. 1A. First, due to the difference in conductivity type between the P-type well 136 and the portion of the N++ source region 138 that is formed in the well 136, a PN junction may be formed. The PN junction may be a "bulk" PN junction that may be used in clamping an ESD voltage between a ground reference voltage and a VDD reference voltage. The presence of the source-well PN junction may offer an opportunity for I/O ESD output protection that may be as efficient as in bulk transistors. Second, the portions 142, 144 of the gate region may be separated from the drain region 148 by a "drift region." The drift region may include a portion of the channel 146 and may comprise, for example, a 5 nm thick, N+ portion of the channel 146. The separation of the portions 142, 144 of the gate region and the drain region 148 may protect the gate oxide 142 from high voltage spikes applied to the gate. The separation between the gate portions 142, 144 and the drain region 148 may thus reduce an electric field in the gate dielectric 142, such that the NMOS vertical nanowire FET 132 may be used for ESD protection (e.g., in the ESD protection circuit 104 of FIG. 1A). In one example, the separation of the gate portions 142, 144 and the drain region 148 may effectively provide a series resistance between the source region 138 and the drain region 148. The use of the PN junction and the drift region for ESD protection are described in greater detail below, with respect to FIGS. 3A-6B.

The PMOS vertical nanowire FET 134 may include an N-type well 160 formed in the substrate 131. A nanowire included in the PMOS vertical nanowire FET 134 may include i) a P++ source region 162 that is formed at a first end of the nanowire, and ii) a P++ drain region 172 that is formed at a second end of the nanowire that is opposite the first end. The P++ source region 162 may further include a portion that is formed in the well 160. The PMOS vertical nanowire FET 134 may further include a P+ nanowire channel 170 that connects the source and drain regions 162, 172.

A gate region may surround a portion of the nanowire channel 170. The gate region may include a gate dielectric 166 and a gate metal 168 that surround the portion of the nanowire channel 170. Above and below the gate region, ILD material 164 may surround portions of the nanowire. A drain silicide 174 may be in contact with the drain region 172 of the PMOS vertical nanowire FET 134, and a drain contact 180 may be electrically connected to the drain silicide 174. A source contact 178 may be in contact with the source region 162. The PMOS vertical nanowire FET 134 may include characteristics that can be used to attenuate an ESD-induced voltage included in an input signal, such that the PMOS vertical nanowire FET 134 may be used in the ESD protection circuit 104 of FIG. 1A. For example, similar to those characteristics described above with reference to the NMOS vertical nanowire FET 132, the PMOS vertical nanowire FET 134 may include i) a PN junction between the well 160 and the source region 162, and ii) a drift region that separates the portions 166, 168 of the gate region from the drain region 172. The drift region may include a portion of the channel 170 and may comprise, for example, a 5 nm thick, P+ portion of the channel 170.

Figure 1D:
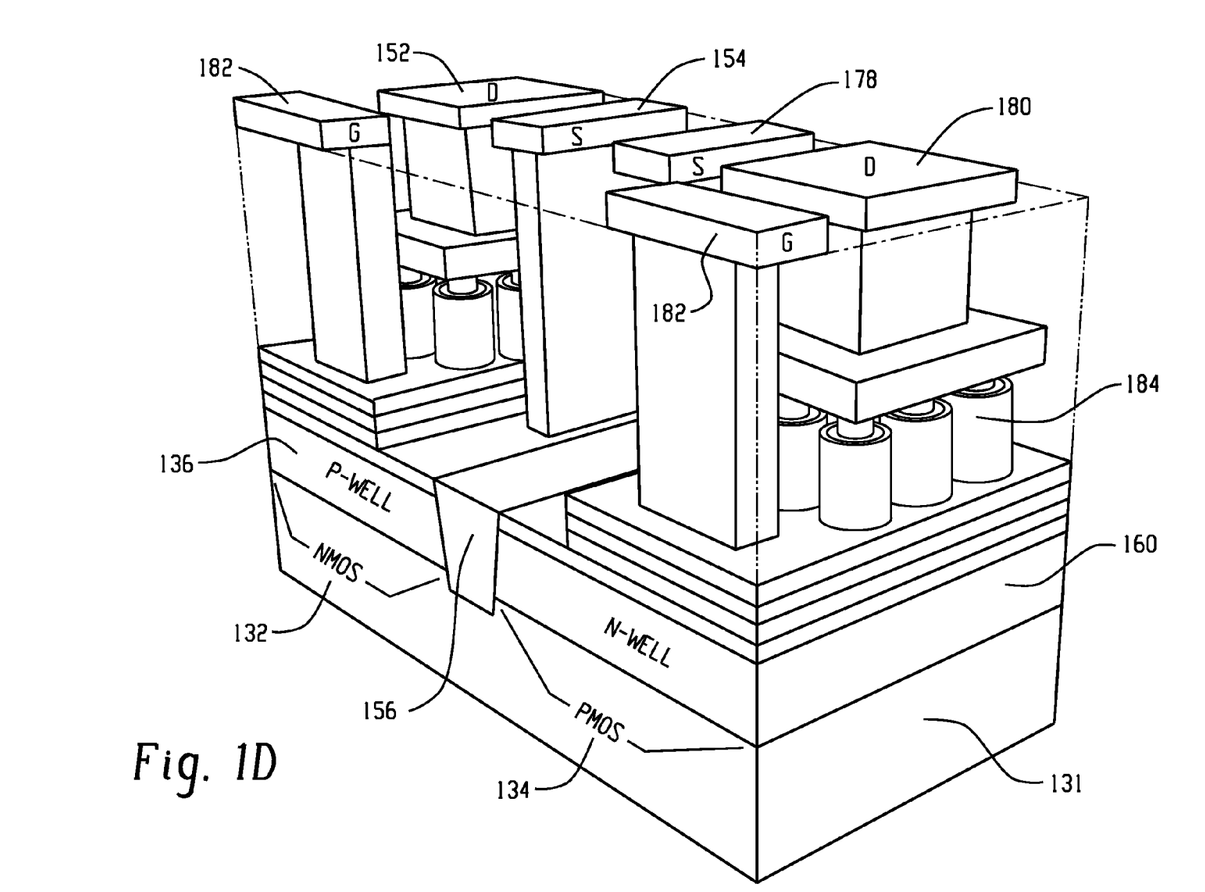
FIG. 1D depicts a three-dimensional (3D) view of an example vertical GAA CMOS structure.

FIG. 1D depicts a three-dimensional (3D) view of the example vertical GAA CMOS structure from FIG. 1C. As illustrated in FIG. 1D, the P-type well 136 of the NMOS vertical nanowire FET 132 and the N-type well 160 of the PMOS vertical nanowire FET 134 may be disposed side-by-side on the semiconductor substrate 131. Drain and source contacts 152, 154, 178, 180 for the NMOS vertical nanowire FET 132 and the PMOS vertical nanowire FET 134 may be located at an upper portion of the structure. Gate contacts 182 for the gate regions of the FETs 132, 134 may also be located at the upper portion of the structure, as illustrated in FIG. 1D. The gate-all-around (GAA) structure used in the FETs 132, 134 may be illustrated at 184 of FIG. 1D, which depicts the gate dielectrics 142, 166 and the gate metals 144, 168 surrounding the nanowire channels 146, 170 of the FETs 132, 134.

Figure 2:
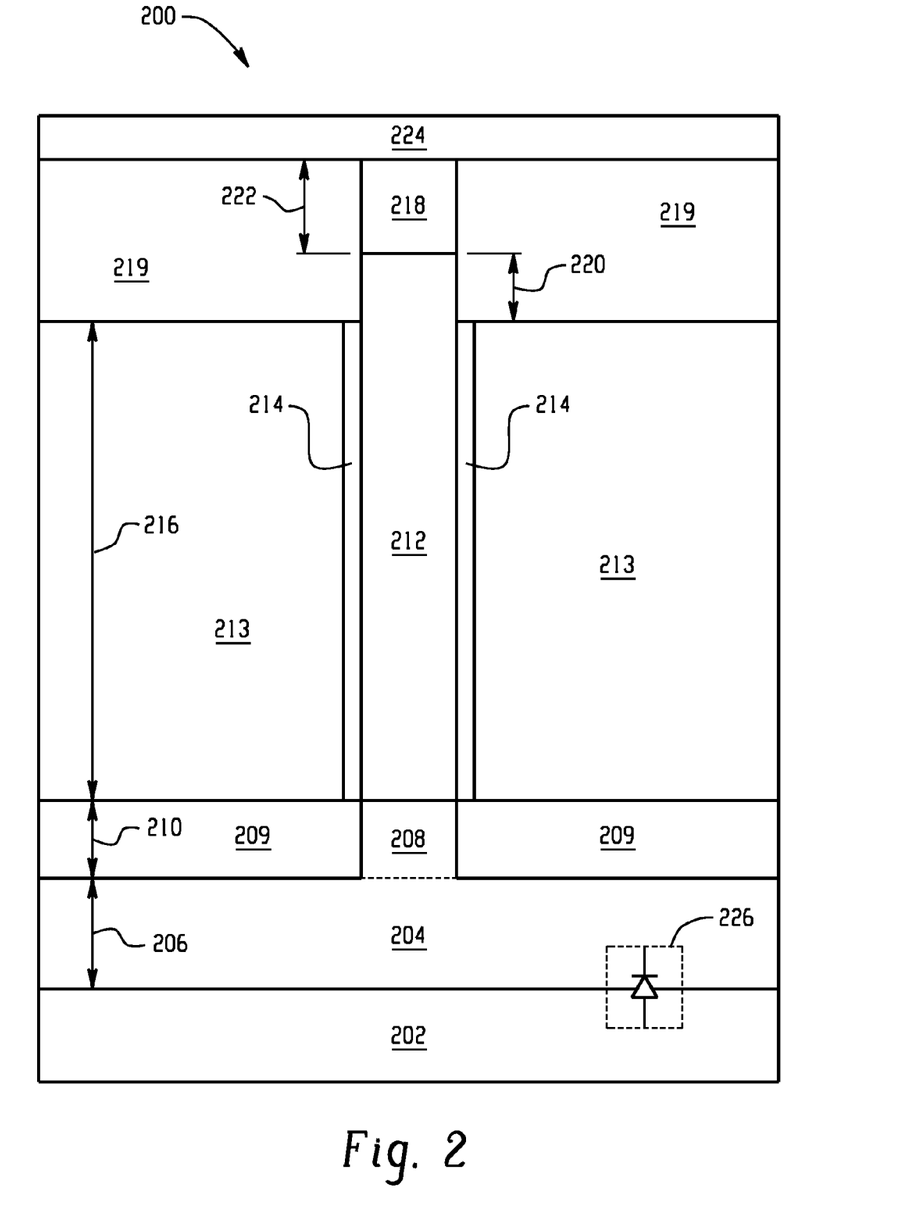
FIG. 2 depicts an example n-channel, vertical nanowire FET with an asymmetry between a source region and a drain region.

FIG. 2 depicts an example n-channel, vertical nanowire FET 200 with an asymmetry between a source region and a drain region 218. In the example vertical nanowire FET 200, a P-type well 202 may be formed in a semiconductor substrate. The source region including portions 204, 208 may be formed substantially over the P-type well 202 and may have an N++ doping of $2.00 \times 10^{20}$ cm$^{-3}$. The source region may thus include the portion 208 at a first end of a nanowire and the portion 204 that is formed in the well 202. A thickness 206 of the portion 204 of the source region that is formed in the well 202 may be within a range of approximately 15 nm-150 nm. A thickness 210 of the portion 208 of the source region at the first end of the nanowire may be equal to approximately 5 nm.

Because of the difference in conductivity types between the P-type well 202 and the N++ portion 204 of the source region, a PN junction 226 may be formed. As described in further detail below, with respect to FIGS. 3A-6B, the PN junction 226 may function as a diode, and multiple, similar PN junctions may be used to clamp an ESD-induced voltage within an acceptable range (e.g., within a range of GND to VDD reference voltages). It is noted that the PN junction 226 may be described as being a relatively "large" or "bulk" PN junction (e.g., the PN junction 226 may be formed between the well 202 and the portion 204 of the source region, which may include a large, planar area over which the PN junction may be formed). The large, bulk PN junction 226 may offer an opportunity for input/output ESD protection as efficient as in bulk transistors. Thus, although a single, "stand-alone" vertical nanowire FET may have relatively weak resistance to ESD, the use of multiple nanowire FETs as described herein (e.g., using multiple PN junctions formed in the multiple nanowire FETs to clamp an ESD-induced voltage) may provide adequate ESD protection for use in input/output transistors.

Interlayer dielectric (ILD) material 209 may be disposed substantially over the portion 204 and may surround the portion 208. A nanowire channel 212 with an N+ doping level of approximately between $1.00 \times 10^{18}$ cm$^{-3}$ and $1.00 \times 10^{20}$ cm$^{-3}$ may connect the portions 204, 208 of the source region with a drain region 218. The nanowire channel 212 may be wrapped in portions of a gate region, where the portions of the gate region may include a gate metal 213 and a gate dielectric 214. A thickness 216 of the portions 213, 214 of the gate region may be equal to approximately 15 nm.

The drain region 218 that may be disposed substantially over the nanowire channel 212 may have an N++ doping of several times $10^{20}$ cm$^{-3}$ and may have a thickness 222 of approximately 5 nm. The drain region 218 may be surrounded in an ILD material 219, and a drain silicide or drain contact 224 may be disposed substantially over the drain region 218. The drain region 218 may be separated from the gate dielectric 214 by a "drift region" 220, where the drift region 220 may be a distance that separates the drain region from the gate region. In one example, the drift region 220 may have a thickness of approximately 5 nm and may be understood as including a portion of the N+ nanowire channel. In other examples, however, the drift region 220 may have a thickness within a range of approximately 1 nm to several tens of nanometers. As described in further detail below with reference to FIGS. 3A-6B, the drift region 220 may provide a resistance in series between the drain region 218 and the source region 204, 208. The drift region 220 may protect the gate dielectric 214 from high voltage spikes applied to the gate region, thus reducing an electric field in the gate dielectric 214. The drift region 220 may further decrease the electric field in the gate dielectric 214 when a spike of voltage is applied to the drain region 218.

In the example of FIG. 2, the n-channel, vertical nanowire FET 200 may be depicted as being an asymmetrical structure. For example, the drift region 220 is included for the drain region 218, but the source region 204, 208 does not have a similar drift region. However, in other examples, it may be desirable to have a symmetrical vertical nanowire FET structure. In one example symmetrical structure, drift regions may be included for both the source region and the drain region. In another example symmetrical structure, neither the source region nor the drain region may have a drift region. In these examples, adding an additional drift region may increase a resistance value for attenuating an ESD-induced voltage. Removing a drift region may decrease the resistance value for attenuating the ESD-induced voltage.

Figure 3A:
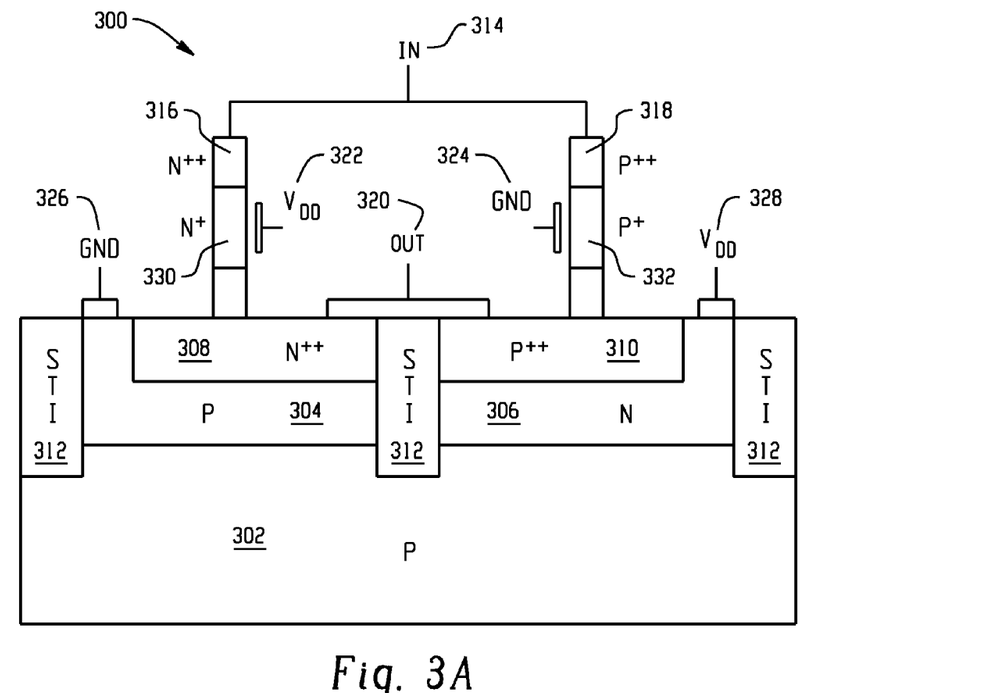
FIG. 3A depicts an example ESD protection circuit including a PMOS vertical nanowire FET and an NMOS vertical nanowire FET connected in an electrically parallel arrangement.

FIG. 3A depicts an example ESD protection circuit 300 including an NMOS vertical nanowire FET and a PMOS vertical nanowire FET connected in an electrically parallel arrangement. The NMOS and PMOS vertical nanowire FETs may be fabricated substantially over a P-type semiconductor substrate 302, and the FETs may be separated from one another in the horizontal direction by shallow trench isolation (STI) regions 312. The NMOS vertical nanowire FET may include a P-type well 304, an N++ source region 308, an N++ drain region 316, and a N+ channel 330. The PMOS vertical nanowire FET may include an N-type well 306, a P++ source region 310, a P++ drain region 318, and a P+ channel 332.

The N+ and P+ channels 330, 332 included in the FETs may be surrounded by gate regions (e.g., gate regions that each include a gate metal and a gate dielectric), and electrical contacts may be electrically connected to the gate regions to allow interaction with external signals and systems. As described above, with reference to FIGS. 1B, 1C, and 2, the source regions 308, 310 of the FETs may include i) a first portion that is formed at a bottom end of the nanowire itself, and ii) a second portion that is formed within an associated well. The second portions of the source regions 308, 310 may have a conductivity type that is different from that of the well regions 304, 306, such that source/well PN junctions are formed in each of the FETs. Additionally, as described above, the drain regions 316, 318 may be separated from the gate regions of the FETs by a distance (i.e., a "drift region"), which may thus provide a resistance in series between the drain and source regions of the respective FETs. In the example of FIG. 3A, the drift regions may comprise 5 nm thick N+ and P+ regions (i.e., portions of the nanowire channels 330, 332). The drift regions may decrease the electric field in the gate dielectrics when a spike of voltage is applied to the drain regions 316, 318, which may provide a higher ESD breakdown voltage.

The example of FIG. 3A may further illustrate various signals or voltages that may be applied to terminals of the FETs. For example, a ground reference voltage ("GND") 326 may be applied to the P-type well 308 of the NMOS vertical nanowire FET, and a VDD reference voltage 322 may be applied to a gate terminal of the NMOS vertical nanowire FET. A VDD reference voltage 328 may also be applied to the N-type well 306 of the PMOS vertical nanowire FET, and a ground reference voltage 324 may be applied to a gate terminal of the PMOS vertical nanowire FET. An input terminal 314 may be connected to the drain regions 316, 318 of the FETs, and an output terminal 320 may be connected to the source regions 308, 310 of the FETs. Based on these connections, the NMOS and PMOS FETs may be described as being connected in an electrically parallel arrangement. Although the example of FIG. 3A may depict two vertical nanowire FETs connected in parallel, in other examples, more than two vertical nanowire FETs may be connected in parallel to withstand ESD current.

The input terminal 314 may be used to receive an input signal from an external source, and the output terminal 320 may be used to pass the input signal to a protected circuit. For example, with reference to FIG. 1A, the input terminal 314 may be connected to the input pad 102, and the output terminal 320 may be connected to the protected circuit 106. The nanowire FETs may be used as input/output transistors to provide ESD protection and may thus protect the protected circuit from an ESD-induced voltage in the input signal.

Figure 3B:
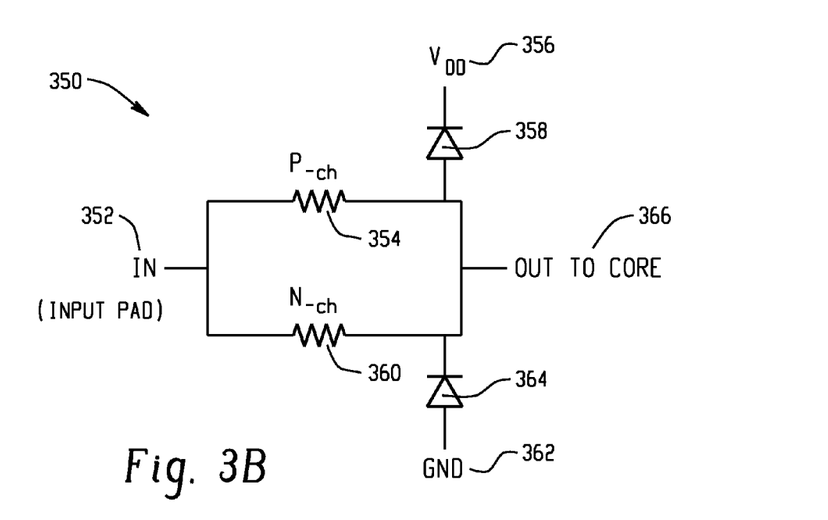
FIG. 3B depicts an example equivalent circuit, where the example equivalent circuit corresponds to the example ESD protection circuit of FIG. 3A.

FIG. 3B depicts an example equivalent circuit 350, where the example equivalent circuit 350 corresponds to the example ESD protection circuit 300 of FIG. 3A. As described above, the ESD protection circuit 300 may include characteristics that can be used to attenuate an ESD-induced voltage in an input signal. The characteristics may include i) the PN junctions formed between the source regions 308, 310 and the well regions 304, 306, and ii) the resistance values provided by the drift regions (i.e., the distances between the gate and drain regions of the FETs).

The example equivalent circuit 350 may illustrate these characteristics and how the characteristics may be used to attenuate an ESD-induced voltage in the input signal. For example, there may be two paths between an input terminal 352 and an output terminal 366 (i.e., corresponding to the input and output terminals 314, 320 of FIG. 3A). A first path may include a resistance 354, where the resistance 354 may correspond to the resistance in series between the source and drain regions 310, 318 of the PMOS vertical nanowire FET. A second path may include a resistance 360, where the resistance 360 may correspond to the resistance in series between the source and drain regions 308, 316 of the NMOS vertical nanowire FET. Both of the resistances in series may be a consequence of the aforementioned drift regions. The drift regions may decrease the electric field in gate dielectrics when a spike of voltage is applied to the input terminal 352 (i.e., when a spike of voltage is applied to the drain regions 316, 318), which may provide a higher ESD breakdown voltage.

The example equivalent circuit 350 may also illustrate the PN junctions formed between the source regions 308, 310 and the well regions 304, 306 via its inclusion of diodes 358, 364. The diode 358 may correspond to the PN junction formed between the source region 310 and the N-type well 306 of the PMOS vertical nanowire FET, and the diode 364 may correspond to the PN junction formed between the source region 308 and the P-type well 304 of the NMOS vertical nanowire FET. A VDD reference voltage 356 may be connected to the diode 358 (e.g., corresponding to the VDD reference voltage 328 of FIG. 3A), and a ground reference voltage 362 may be connected to the diode 364 (e.g., corresponding to the ground reference voltage 326 of FIG. 3A), such that a voltage at the output terminal 366 may be clamped between the ground reference voltage 362 and the VDD reference voltage 356. Thus, in passing an input signal from the input terminal 352 to the output terminal 366, an ESD-induced voltage included in the input signal may be clamped between the ground reference voltage 362 and the VDD reference voltage 356, thus protecting a protected circuit connected to the output terminal 366.

Figure 4A:
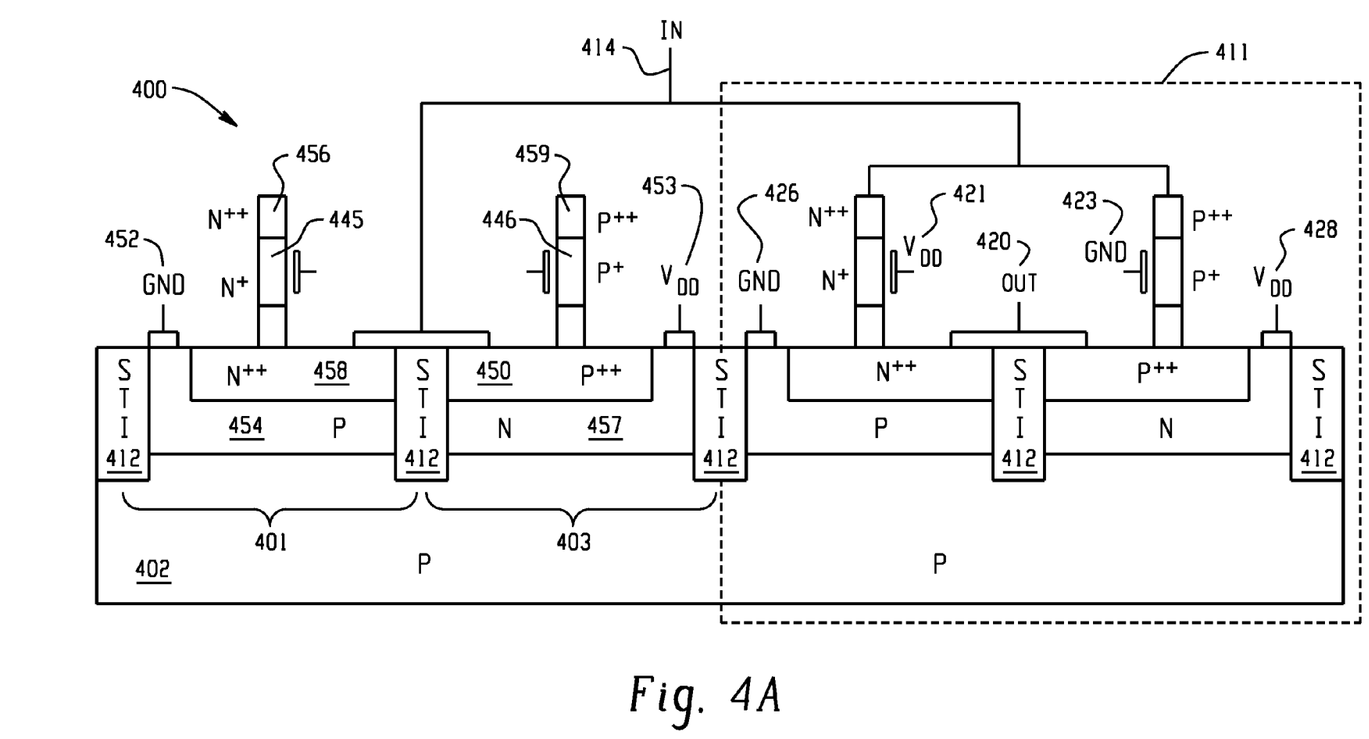
FIG. 4A depicts an example ESD protection circuit including a PMOS vertical nanowire FET and an NMOS vertical nanowire FET that are used to clamp an input voltage between a "ground" reference voltage and a "VDD" reference voltage.

FIG. 4A depicts an example ESD protection circuit 400 including an NMOS vertical nanowire FET 401 and a PMOS vertical nanowire FET 403 that are used to clamp a voltage at an input terminal 414 between a "ground" reference voltage and a "VDD" reference voltage. In the example of FIG. 4A, components included in an area 411 of the circuit 400 may be substantially similar to components included in the example of FIG. 3A. Further, the components in the area 411 may be connected to similar external systems, signals, and voltages as those components included in the example of FIG. 3A. For example, a ground reference voltage ("GND") 426 may be applied to a P-type well of an NMOS vertical nanowire FET, and a VDD reference voltage 421 may be applied to a gate terminal of the NMOS vertical nanowire FET. A VDD reference voltage 428 may also be applied to an N-type well of a PMOS vertical nanowire FET, and a ground reference voltage 423 may be applied to a gate terminal of the PMOS vertical nanowire FET. The input terminal 414 may be connected to the drain regions of these FETs, and an output terminal 420 may be connected to the source regions of these FETs. Thus, in the interest of conciseness, the components of the area 411 are not described in further detail, and reference is made to the description of FIG. 3A.

The NMOS vertical nanowire FET 401 and the PMOS vertical nanowire FET 403 that are used to clamp the input voltage 414 between the ground reference voltage and the VDD reference voltage may be fabricated substantially over a P-type semiconductor substrate 402, and the FETs 401, 403 may be separated from one another in the horizontal direction by shallow trench isolation (STI) regions 412. The NMOS vertical nanowire FET 401 may include a P-type well 454, an N++ source region 458, an N++ drain region 456, and a N+ channel 445. The PMOS vertical nanowire FET 403 may include an N-type well 457, a P++ source region 450, a P++ drain region 459, and a P+ channel 446. Because the source regions 450, 458 may have a conductivity type that is different from that of the well regions 454, 457, source/well PN junctions may be formed in each of the FETS 401, 403. The N+ and P+ channels 445, 446 included in the FETs 401, 403 may be surrounded by gate regions (e.g., gate regions that each include a gate metal and a gate dielectric), and electrical contacts may be electrically connected to the gate regions to allow interaction with external signals and systems.

The example of FIG. 4A may further illustrate various signals and voltages that may be applied to terminals of the FETs 401, 403. For example, a ground reference voltage 452 may be applied to the P-type well 454 of the NMOS vertical nanowire FET 401, and a VDD reference voltage 453 be applied to the N-type well 457 of the PMOS vertical nanowire FET 403. The input terminal 414 may be connected to the source regions 450, 458 of the FETs 401, 403. The input terminal 414 may be used to receive an input signal from an external source, and the output terminal 420 may be used to pass the input signal to a protected circuit.

Figure 4B:
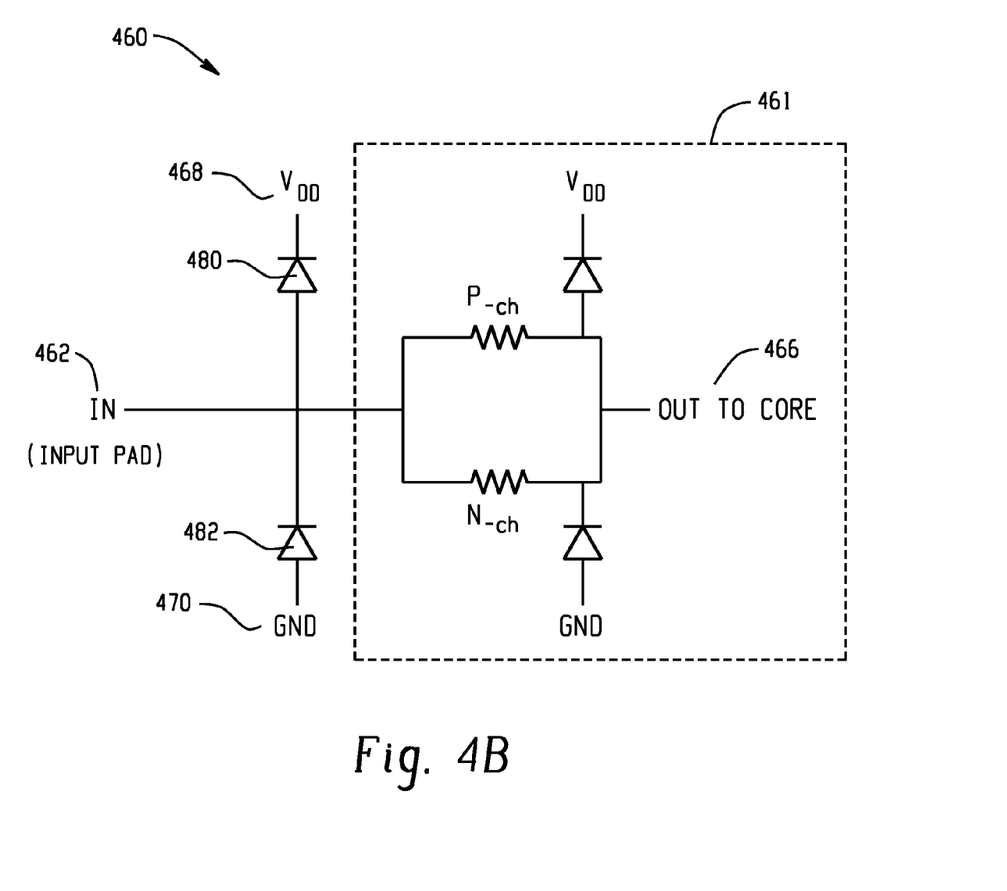
FIG. 4B depicts an example equivalent circuit, where the example equivalent circuit corresponds to the example ESD protection circuit of FIG. 4A.

FIG. 4B depicts an example equivalent circuit 460, where the example equivalent circuit 460 corresponds to the example ESD protection circuit 400 of FIG. 4A. In the example of FIG. 4B, components included in an area 461 of the example equivalent circuit 460 may be substantially similar to components included in the example of FIG. 3B. Further, the components in the area 461 may be connected to similar external systems, signals, and voltages as those components included in the example of FIG. 3B. Thus, in the interest of conciseness, the components of the area 461 are not described in further detail, and reference is made to the description of FIG. 3B.

The example equivalent circuit 460 may illustrate the PN junctions formed between the source regions 450, 458 and the well regions 454, 457 via its inclusion of diodes 480, 482. The diode 480 may correspond to the PN junction formed between the source region 450 and the N-type well 457 of the PMOS vertical nanowire FET 403, and the diode 482 may correspond to the PN junction formed between the source region 458 and the P-type well 454 of the NMOS vertical nanowire FET 401. A VDD reference voltage 468 may be connected to the diode 480 (e.g., corresponding to the VDD reference voltage 453 of FIG. 4A), and a ground reference voltage 470 may be connected to the diode 482 (e.g., corresponding to the ground reference voltage 452 of FIG. 4A), such that a voltage at an input terminal 462 may be clamped between the VDD reference voltage 468 and the ground reference voltage 470. Thus, in passing an input signal from the input terminal 462 to an output terminal 466, an ESD-induced voltage included in the input signal may be clamped between the ground reference voltage 470 and the VDD reference voltage 468, thus protecting a protected circuit connected to the output terminal 466.

Figure 5A:
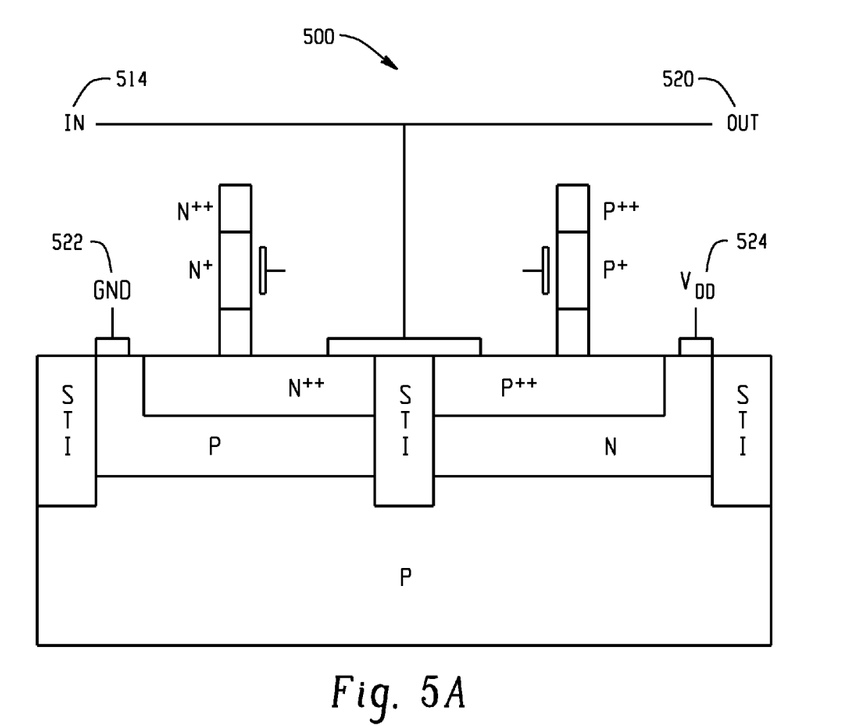
FIG. 5A depicts an example ESD protection circuit that utilizes two PN junctions to clamp an input voltage between a "ground" reference voltage and a "VDD" reference voltage.

FIG. 5A depicts an example ESD protection circuit 500 that utilizes two PN junctions to clamp an input voltage 514 between a "ground" reference voltage and a "VDD" reference voltage. In the example of FIG. 5A, components included in ESD protection circuit 500 may be substantially similar to components included in the examples of FIGS. 3A and 4A. For example, the circuit 500 may include two nanowire FETs that are substantially similar to those described above. Thus, in the interest of conciseness, the FETs are not described in further detail, and reference is made to the description of FIGS. 3A and 4A.

In the example ESD protection circuit 500, a ground reference voltage ("GND") 522 may be applied to a P-type well of an NMOS vertical nanowire FET, and a VDD reference voltage 524 may be applied to an N-type well of a PMOS vertical nanowire FET. An input terminal 514 may be connected to the source regions of these FETs, and an output terminal 520 may also be connected to the source regions of these FETs. The input terminal 514 may be used to receive an input signal from an external source, and the output terminal 520 may be used to pass the input signal to a protected circuit. Because the source regions of the FETs may have a conductivity type that is different from that of the well regions, source/well PN junctions may be formed in each of the FETS.

Figure 5B:
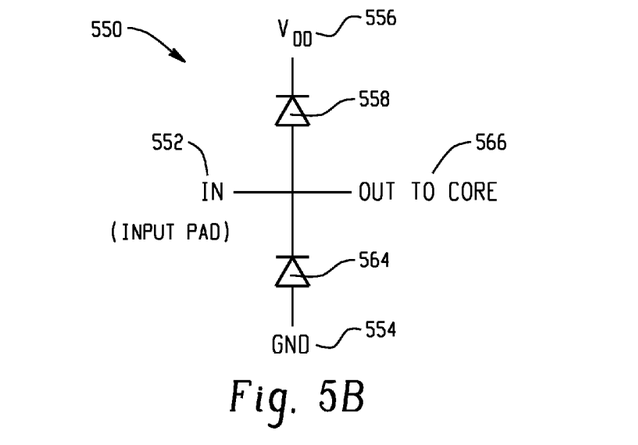
FIG. 5B depicts an example equivalent circuit, where the example equivalent circuit corresponds to the example ESD protection circuit of FIG. 5A.

FIG. 5B depicts an example equivalent circuit 550, where the example equivalent circuit 550 corresponds to the example ESD protection circuit 500 of FIG. 5A. The example equivalent circuit 550 may illustrate the PN junctions formed between the source regions and the well regions via its inclusion of diodes 558, 564. The diode 558 may correspond to the PN junction formed between the P++ source region and the N-type well of the PMOS vertical nanowire FET of FIG. 5A, and the diode 564 may correspond to the PN junction formed between the N++ source region and the P-type well of the NMOS vertical nanowire FET. A VDD reference voltage 556 may be connected to the diode 558 (e.g., corresponding to the VDD reference voltage 524 of FIG. 5A), and a ground reference voltage 554 may be connected to the diode 564 (e.g., corresponding to the ground reference voltage 522 of FIG. 5A), such that a voltage at an input terminal 552 may be clamped between the ground reference voltage 554 and the VDD reference voltage 556. Thus, in passing an input signal from the input terminal 552 to an output terminal 566, an ESD-induced voltage included in the input signal may be clamped between the VDD reference voltage 556 and the ground reference voltage 554, thus protecting a protected circuit connected to the output terminal 566.

Figure 6A:
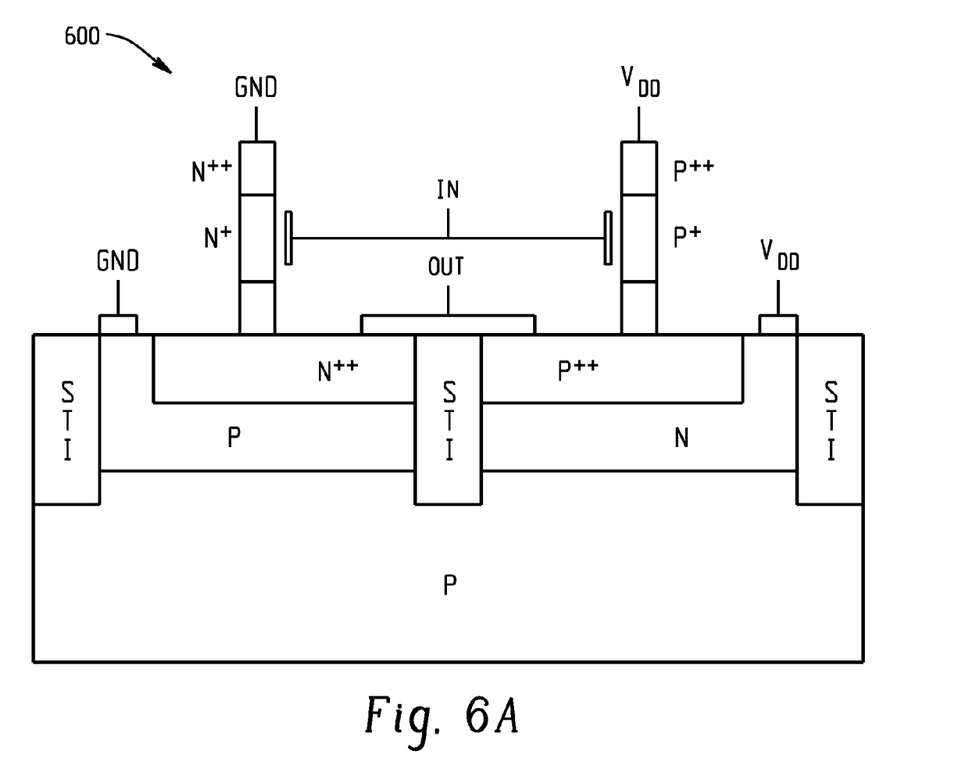
FIG. 6A depicts an example system including an output buffer with ESD protection.
Figure 6B:
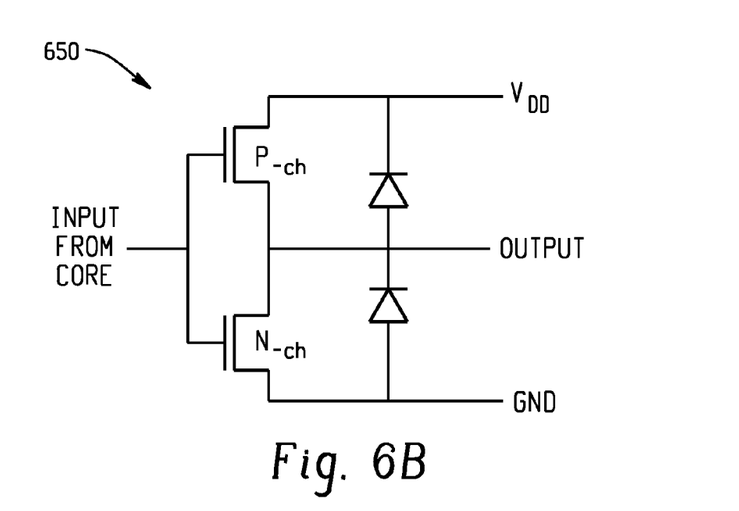
FIG. 6B depicts an example equivalent circuit, where the example equivalent circuit corresponds to the example system of FIG. 6A.

FIG. 6A depicts an example system 600 including an output buffer with ESD protection. FIG. 6B depicts an example equivalent circuit 650, where the example equivalent circuit 650 corresponds to the example system 600 of FIG. 6A. In FIG. 6A, an input terminal may be connected to gate regions of an NMOS vertical nanowire FET and a PMOS vertical nanowire FET, and an output terminal may be connected to source regions of the FETs. As illustrated in FIGS. 6A and 6B, source/well PN junctions in the vertical nanowire FETs may be used to provide protection diodes directly at the output terminal. The protection diodes and applied ground and VDD reference voltages may be used to clamp a voltage at the output terminal between the ground and VDD reference voltages. Additional nanowires may be placed in parallel to achieve higher current ESD protection.

The present disclosure is directed to a system for protecting a circuit from an electrostatic discharge (ESD) voltage. An example system for protecting a circuit from an ESD voltage includes an input terminal for receiving an input signal. The system also includes an ESD protection circuit configured to receive the input signal from the input terminal. The ESD protection circuit includes one or more vertical nanowire field effect transistors (FETs). Each of the one or more vertical nanowire FETs includes a well of a first conductivity type that is formed in a semiconductor substrate. Each of the one or more vertical nanowire FETs also includes a nanowire having i) a source region at a first end of the nanowire, and ii) a drain region at a second end of the nanowire that is opposite the first end. The source region further includes a portion formed in the well, where the source region and the drain region are of a second conductivity type such that a PN junction is formed between the well and the portion of the source region formed in the well. Each of the one or more vertical nanowire FETs further includes a gate region that surrounds a portion of the nanowire. The gate region is separated from the drain region by a first distance, where the separation of the gate region and the drain region provides a resistance in series between the drain region and the source region. The system further includes an output terminal configured to receive the input signal from the ESD protection circuit. An ESD-induced voltage in the input signal is attenuated by the resistance and the PN junction.

In another example, an example system for protecting a circuit from an ESD voltage includes an input terminal for receiving an input signal. The system also includes a semiconductor substrate including a first well region and a second well region, where the first well region is of a first conductivity type and the second well region is of a second conductivity type. The system further includes an ESD protection circuit configured to receive the input signal from the input terminal. The ESD protection circuit includes a first vertical nanowire field effect transistor (FET), where a first PN junction is formed between the first well region and a source or drain region of the first vertical nanowire FET. The ESD protection circuit also includes a second vertical nanowire FET, where a second PN junction is formed between the second well region and a source or drain region of the second vertical nanowire FET. The system also includes an output terminal configured to receive the input signal from the ESD protection circuit.

In another example, an example system for protecting a circuit from an ESD voltage includes an input terminal for receiving an input signal. The system also includes an ESD protection circuit configured to receive the input signal from the input terminal. The ESD protection circuit includes one or more vertical nanowire field effect transistors (FETs). Each of the one or more vertical nanowire FETs includes a well of a first conductivity type that is formed in a semiconductor substrate. Each of the one or more vertical nanowire FETs also includes a nanowire having i) a drain region at a first end of the nanowire, and ii) a source region at a second end of the nanowire that is opposite the first end. The drain region further includes a portion formed in the well, where the source region and the drain region are of a second conductivity type such that a PN junction is formed between the well and the portion of the drain region formed in the well. Each of the one or more vertical nanowire FETs further includes a gate region that surrounds a portion of the nanowire. The gate region is separated from the source region by a first distance, where the separation of the gate region and the source region provides a resistance in series between the drain region and the source region. The system further includes an output terminal configured to receive the input signal from the ESD protection circuit. An ESD-induced voltage in the input signal is attenuated by the resistance and the PN junction.

This written description uses examples to disclose the disclosure, including the best mode, and also to enable a person skilled in the art to make and use the disclosure. The patentable scope of the disclosure may include other examples. It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

It is claimed:

1. A system for protecting a circuit from an electrostatic discharge (ESD) voltage, the system comprising:
    an input terminal for receiving an input signal;
    an ESD protection circuit configured to receive the input signal from the input terminal, the ESD protection circuit including one or more vertical nanowire field effect transistors (FETs), wherein each of the one or more vertical nanowire FETs includes:
        a well of a first conductivity type that is formed in a semiconductor substrate,
        a nanowire having i) a source region at a first end of the nanowire, and ii) a drain region at a second end of the nanowire that is opposite the first end, the source region further including a portion formed in the well, wherein the source region and the drain region are of a second conductivity type such that a PN junction is formed between the well and the portion of the source region formed in the well, and
        a gate region surrounding a portion of the nanowire, wherein the gate region is separated from the drain region by a first distance, the separation of the gate region and the drain region providing a resistance in series between the drain region and the source region; and
    an output terminal configured to receive the input signal from the ESD protection circuit, wherein an ESD-induced voltage in the input signal is attenuated by the resistance and the PN junction.

2. The system of claim 1, wherein a second circuit is coupled to the output terminal, and wherein the second circuit is protected from the ESD-induced voltage.

3. The system of claim 2, wherein the input terminal, the ESD protection circuit, the output terminal, and the second circuit comprise portions of an integrated circuit, wherein the second circuit includes one or more core transistors that implement a logical design for the integrated circuit, and wherein the one or more vertical nanowire FETs of the ESD protection circuit are input/output transistors for the integrated circuit.

4. The system of claim 3, wherein a same type of vertical nanowire FET is used for the one or more core transistors and for the input/output transistors.

5. The system of claim 1, wherein the one or more vertical nanowire FETs are junctionless accumulation-mode nanowire transistors.

6. The system of claim 1, wherein the gate region includes a gate dielectric, and wherein the resistance reduces an electric field in the gate dielectric.

7. The system of claim 1, wherein the ESD protection circuit includes:
    a PMOS vertical nanowire FET, the PMOS vertical nanowire FET including an N-type well, a P-type source region, and a P-type drain region; and
    an NMOS vertical nanowire FET, the NMOS vertical nanowire FET including a P-type well, an N-type source region, and an N-type drain region, wherein the PMOS vertical nanowire FET and the NMOS vertical nanowire FET are connected in an electrically parallel arrangement.

8. The system of claim 7, wherein the input terminal is connected to the drain region of the PMOS vertical nanowire FET and the drain region of the NMOS vertical nanowire FET, and the output terminal is connected to the source region of the PMOS vertical nanowire FET and the source region of the NMOS vertical nanowire FET.

9. The system of claim 8, wherein a first path between the input terminal and the output terminal includes the resistance in series between the drain and source regions of the PMOS vertical nanowire FET, and wherein a second path between the input terminal and the output terminal includes the resistance in series between the drain and source regions of the NMOS vertical nanowire FET.

10. The system of claim 8, wherein a ground reference voltage is applied to one of the PMOS vertical nanowire FET or the NMOS vertical nanowire FET, wherein a VDD reference voltage is applied to the other of the PMOS vertical nanowire FET or the NMOS vertical nanowire FET, and wherein the PN junctions of the PMOS and NMOS vertical nanowire FETs clamp a voltage at the output terminal between the ground reference voltage and the VDD reference voltage.

11. The system of claim 10, wherein the ground reference voltage is applied to the P-type well of the NMOS vertical nanowire FET, and wherein the VDD reference voltage is applied to the N-type well of the PMOS vertical nanowire FET.

12. The system of claim 8, wherein the ESD protection circuit further includes:
a second PMOS vertical nanowire FET, the second PMOS vertical nanowire FET including a second N-type well, a second P-type source region, and a second P-type drain region; and
a second NMOS vertical nanowire FET, the second NMOS vertical nanowire FET including a second P-type well, a second N-type source region, and a second N-type drain region,
wherein the input terminal is connected to i) the second P-type source region of the second PMOS vertical nanowire FET, and ii) the second N-type source region of the second NMOS vertical nanowire FET.

13. The system of claim 12, wherein a ground reference voltage is applied to one of the second PMOS vertical nanowire FET or the second NMOS vertical nanowire FET, wherein a VDD reference voltage is applied to the other of the second PMOS vertical nanowire FET or the second NMOS vertical nanowire FET, and wherein the PN junctions of the second PMOS and the second NMOS vertical nanowire FETs clamp a voltage at the input terminal between the ground reference voltage and the VDD reference voltage.

14. The system of claim 13, wherein the ground reference voltage is applied to the second P-type well of the second NMOS vertical nanowire FET, and wherein the VDD reference voltage is applied to the second N-type well of the second PMOS vertical nanowire FET.

15. A system for protecting a circuit from an electrostatic discharge (ESD) voltage, the system comprising:
an input terminal for receiving an input signal;
a semiconductor substrate including a first well region and a second well region, wherein the first well region is of a first conductivity type, and the second well region is of a second conductivity type;
an ESD protection circuit configured to receive the input signal from the input terminal, the ESD protection circuit including:
a first vertical nanowire field effect transistor (FET), wherein a first PN junction is formed between the first well region and a source or drain region of the first vertical nanowire FET, and
a second vertical nanowire FET, wherein a second PN junction is formed between the second well region and a source or drain region of the second vertical nanowire FET; and
an output terminal configured to receive the input signal from the ESD protection circuit.

16. The system of claim 15, wherein the input terminal is connected to the source region of the first vertical nanowire FET and the source region of the second vertical nanowire FET, wherein the output terminal is connected to the source region of the first vertical nanowire FET and the source region of the second vertical nanowire FET, wherein a ground reference voltage is coupled to the first PN junction, wherein a VDD reference voltage is coupled to the second PN junction, and wherein the first and second PN junctions clamp a voltage at the input terminal between the ground reference voltage and the VDD reference voltage.

17. The system of claim 15,
wherein the first vertical nanowire FET is a PMOS vertical nanowire FET, the PMOS vertical nanowire FET including an N-type well, a P-type source region, a P-type drain region, and a first gate region; and
wherein the second vertical nanowire FET is an NMOS vertical nanowire FET, the NMOS vertical nanowire FET including a P-type well, an N-type source region, an N-type drain region, and a second gate region,
wherein a ground reference voltage is applied to the P-type well and the N-type drain region of the NMOS vertical nanowire FET,
wherein a VDD reference voltage is applied to the N-type well and the P-type drain region of the PMOS vertical nanowire FET,
wherein the input terminal is connected to the first gate region and the second gate region,
wherein the output terminal is connected to the P-type source region of the PMOS vertical nanowire FET and to the N-type source region of the NMOS vertical nanowire FET, and
wherein the first and second PN junctions clamp a voltage at the output terminal between the ground reference voltage and the VDD reference voltage.

18. The system of claim 15,
wherein the first vertical nanowire FET includes a first gate region that is separated from the source or drain region of the first vertical nanowire FET by a first distance,
wherein the second vertical nanowire FET includes a second gate region that is separated from the source or drain region of the second vertical nanowire FET by a second distance, and
wherein the first distance and the second distance attenuate the ESD-induced voltage by lowering an electric field in the first and second gate regions.

19. The system of claim 15, wherein a second circuit is coupled to the output terminal, and wherein the second circuit is protected from the ESD-induced voltage.

20. A system for protecting a circuit from an electrostatic discharge (ESD) voltage, the system comprising:
an input terminal for receiving an input signal;
an ESD protection circuit configured to receive the input signal from the input terminal, the ESD protection circuit including one or more vertical nanowire field effect transistors (FETs), wherein each of the one or more vertical nanowire FETs includes:
a well of a first conductivity type that is formed in a semiconductor substrate,
a nanowire having i) a drain region at a first end of the nanowire, and ii) a source region at a second end of the nanowire that is opposite the first end, the drain region further including a portion formed in the well, wherein the drain region and the source region are of a second conductivity type such that a PN junction is formed between the well and the portion of the drain region formed in the well, and
a gate region surrounding a portion of the nanowire, wherein the gate region is separated from the source region by a first distance, the separation of the gate region and the source region providing a resistance in series between the source region and the drain region; and
an output terminal configured to receive the input signal from the ESD protection circuit, wherein an ESD-induced voltage in the input signal is attenuated by the resistance and the PN junction.

* * * * *